US007579976B1

(12) United States Patent
Valentine et al.

(10) Patent No.: US 7,579,976 B1
(45) Date of Patent: Aug. 25, 2009

(54) SYSTEMS AND METHODS FOR DISCRIMINATING SIGNALS IN A MULTI-BAND DETECTOR

(75) Inventors: Michael D. Valentine, Cincinnati, OH (US); Gary E. Carrelli, Cincinnati, OH (US)

(73) Assignee: Valentine Research, Inc., Cincinnati, OH (US)

( * ) Notice: Subject to any disclaimer, the term of this patent is extended or adjusted under 35 U.S.C. 154(b) by 0 days.

(21) Appl. No.: 12/268,060

(22) Filed: Nov. 10, 2008

Related U.S. Application Data

(63) Continuation of application No. 11/283,095, filed on Nov. 18, 2005, now Pat. No. 7,450,051.

(51) Int. Cl.
G01S 7/40 (2006.01)

(52) U.S. Cl. .............................. 342/20; 342/98; 342/99; 342/159; 342/195

(58) Field of Classification Search .................. 342/20, 342/91, 98, 99, 159, 162, 195
See application file for complete search history.

(56) References Cited

U.S. PATENT DOCUMENTS

| | | | | |
|---|---|---|---|---|
| 3,683,376 | A | * | 8/1972 | Pronovost et al. ............. 342/28 |
| 4,190,838 | A | * | 2/1980 | Kemp ........................... 342/20 |
| 4,723,302 | A | | 2/1988 | Fulmer et al. |
| 4,952,936 | A | | 8/1990 | Martinson |
| 5,268,689 | A | | 12/1993 | Ono et al. |
| 5,305,007 | A | | 4/1994 | Orr et al. |
| 5,315,302 | A | | 5/1994 | Katsukura et al. |
| 5,504,488 | A | | 4/1996 | Henderson et al. |
| 5,510,859 | A | | 4/1996 | Douglass et al. |
| 5,666,120 | A | | 9/1997 | Kline et al. |
| 5,781,145 | A | * | 7/1998 | Williams et al. ............... 342/20 |
| 5,835,052 | A | | 11/1998 | Iwakuni |
| 5,852,417 | A | | 12/1998 | Valentine et al. |
| 5,856,801 | A | | 1/1999 | Valentine et al. |
| 5,900,832 | A | | 5/1999 | Valentine et al. |
| 5,917,441 | A | | 6/1999 | Valentine et al. |
| 6,154,166 | A | | 11/2000 | Sawada et al. |
| 6,175,324 | B1 | | 1/2001 | Valentine et al. |
| 6,175,325 | B1 | | 1/2001 | Ono |
| 6,400,305 | B1 | | 6/2002 | Kuhn |
| 6,400,310 | B1 | | 6/2002 | Byrnes et al. |
| 6,411,250 | B1 | | 6/2002 | Oswald et al. |
| 6,483,452 | B1 | | 11/2002 | Iwakini |
| 6,643,494 | B1 | | 11/2003 | Worthy |
| 6,950,053 | B1 | * | 9/2005 | Peterson ........................ 342/20 |
| 7,061,423 | B1 | | 6/2006 | Valentine et al. |
| 2005/0200514 | A1 | * | 9/2005 | Peterson ........................ 342/20 |
| 2005/0266818 | A1 | | 12/2005 | Johnson et al. |
| 2006/0246861 | A1 | | 11/2006 | Dosanjh et al. |
| 2008/0169960 | A1 | * | 7/2008 | Rosenbury ..................... 342/27 |

* cited by examiner

*Primary Examiner*—John B Sotomayor
(74) *Attorney, Agent, or Firm*—Stevens & Showalter LLP

(57) ABSTRACT

A radar detector is operated to suppress nuisance radar alerts by identifying a first signal in radar band of interest, e.g., having a frequency that is a harmonic of a first nuisance local oscillator frequency leaked from a nearby radar detector and identifying a second signal having a frequency that is a harmonic of a second nuisance local oscillator frequency leaked from the radar detector where the first and second local oscillators are companion signals. A detector is also provided that suppresses nuisance radar alerts by detecting a first signal in a radar band, providing a first alert designating the detection of the first signal, determining that the first signal is a nuisance signal, providing a second alert designating that the first signal is a false alarm, and turning off the second alert after a predetermined period.

19 Claims, 4 Drawing Sheets

SYSTEMS AND METHODS FOR DISCRIMINATING SIGNALS IN A MULTI-BAND DETECTOR

CROSS REFERENCE TO RELATED APPLICATION

This application is a continuation of U.S. patent application Ser. No. 11/283,095 filed Nov. 18, 2005, for SYSTEMS AND METHODS FOR DISCRIMINATING SIGNALS IN A MULTI-BAND DETECTOR, now U.S. Pat. No. 7,450,051, which is assigned to the assignee of the present application and is incorporated herein by reference in its entirety.

BACKGROUND OF THE INVENTION

The present invention relates in general to multi-band electromagnetic wave detectors and, more particularly, to radar detectors and methods of operating radar detectors that identify and/or inhibit detected in-band signals that are not of interest, e.g., signals that are transmitted by other radar detectors.

Police and other authorities use radar waves to monitor the speed of various objects, including the speed of motor vehicles. Such radar devices are typically operated in one of four frequency ranges or bands, including the X band, which spans the range of 10.50 gigahertz (GHz) to 10.55 GHz, the Ku band, which spans the range of 13.40 GHz to 13.50 GHz, the K band, which spans the range of 24.05 GHz to 24.25 GHz and the Ka band, which spans the range of 33.4 GHz to 36.0 GHz. Electromagnetic signals within the above bands may thus be monitored to alert a motorist of the presence of radar devices.

A conventional radar detector comprises a superheterodyne radio receiver that includes generally, an antenna, a mixer and a detector. The mixer combines the electromagnetic signals received by the antenna with a local oscillator signal that is repeatedly swept to scan one or more of the X, Ku, K and Ka bands to convert the frequency of the received signals in the swept bands to a predetermined intermediate frequency at the mixer output. The detector circuitry analyzes the signals from the mixer output, which have been converted to the intermediate frequency, to determine whether in-band radar signals are present.

In practice, the local oscillator signal may be derived from any one of two or more local oscillators that are switched in a time-sharing sequence according to the particular band being scanned. For example, a first local oscillator may be swept for detection of the X and K bands, a second local oscillator may be swept for the detection of the lower portion of the Ka band and a third local oscillator may be swept for the detection of the upper portion of the Ka band. Due to the location of the local oscillators, their corresponding mixer and antenna, conventional radar detectors leak electromagnetic waves corresponding to the fundamental frequency of the local oscillators and their corresponding harmonic spectra via the antenna.

Accordingly, when operating a radar detector in the vicinity of one or more other radar detectors, it is possible that a first detected signal that is in the harmonic spectra of an electromagnetic wave leaked by a nearby detector will be falsely recognized as a radar signal if the first detected signal is contained in a radar band being scanned. This phenomenon is particularly prevalent when scanning the Ka band as either the second harmonic or the third harmonic of many leaky local oscillator frequencies falls within the Ka band.

SUMMARY OF THE INVENTION

According to one aspect of the present invention, a method of operating a radar detector to suppress nuisance radar alerts due to signals received in a radar band which are not radar signals of interest comprises detecting a first signal in a radar band of interest and providing a first alert designating the detection of the first signal. It is then determined whether the first signal is a nuisance signal that should be suppressed. A second alert is provided to designate that the first signal is a false alarm if it is determined that the first signal is a nuisance signal with the second alert being turned off after a predetermined period.

According to another aspect of the present invention, a radar detector capable of suppressing nuisance radar alerts due to signals received in a radar band which are not radar signals of interest comprises a first processing stage that receives and filters incoming electromagnetic signals and a second processing stage coupled to the first processing stage that shifts the frequency of filtered electromagnetic signals received by the first processing stage. Control circuitry controls the first processing stage and the second processing stage with the control circuitry having a processor and memory having code embodied therein. The code embodied in the memory comprises code executable by the processor to detect a first signal in a radar band of interest; code executable by the processor to provide a first alert designating the detection of the first signal; code executable by the processor to determine whether the first signal is a nuisance signal that should be suppressed; code executable by the processor to provide a second alert designating that the first signal is a false alarm if it is determined that the first signal is a nuisance signal; and code executable by the processor to turn off the second alert after a predetermined period.

BRIEF DESCRIPTION OF THE SEVERAL VIEWS OF THE DRAWINGS

The following detailed description of the preferred embodiments of various embodiments of the present invention can be best understood when read in conjunction with the following drawings, where like structure is indicated with like reference numerals, and in which.

DETAILED DESCRIPTION OF THE INVENTION

In the following detailed description of the illustrated embodiments, reference is made to the accompanying drawings that form a part hereof, and in which is shown by way of illustration, and not by way of limitation, specific embodiments in which the invention may be practiced. It is to be understood that other embodiments may be utilized and that changes may be made without departing from the spirit and scope of various embodiments of the present invention.

Figure 1:
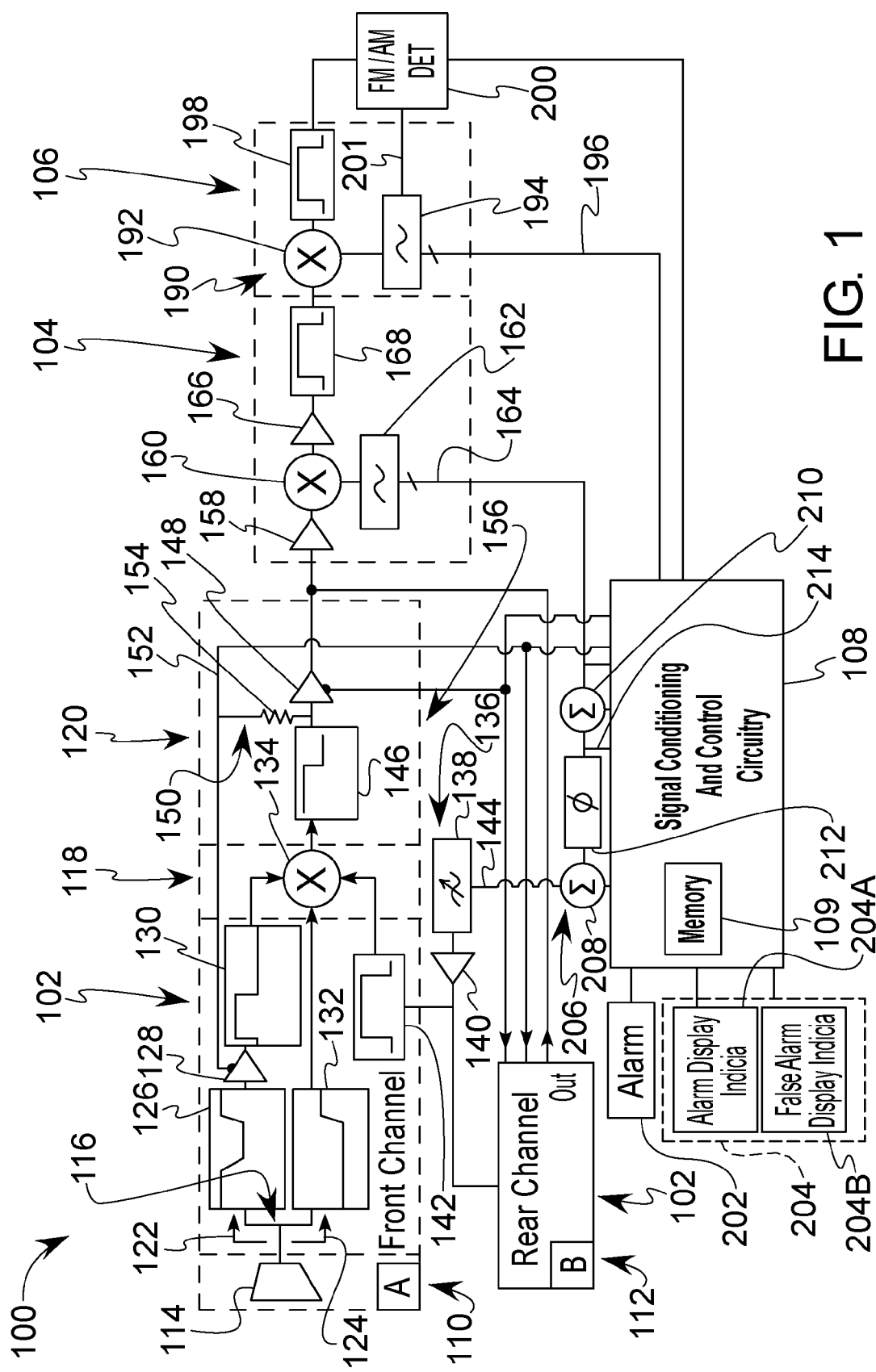
FIG. 1 is a schematic block diagram of a radar detector suitable for implementing various aspects of the present invention.

Referring now to the drawings, and particularly to FIG. 1, a radar detector 100 is illustrated in schematic block diagram form. The radar detector 100 includes generally, a first processing stage 102, a second processing stage 104, a third processing stage 106 and corresponding signal conditioning and control circuitry 108. The first processing stage 102 receives and filters incoming electromagnetic signals. The second processing stage 104 shifts the frequency of the filtered electromagnetic signals to a first intermediate frequency range, and the third processing stage 106 further shifts the frequency range of the filtered electromagnetic signals to a range suitable for detection of signals of interest. The signal conditioning and control circuitry 108 may include memory 109 and other circuitry, such as a microprocessor and/or other logic to control the operation of the detector 100 as will be described in greater detail below.

In the illustrative example of FIG. 1, the radar detector 100 is configured to detect signals in the frequency range of typical law enforcement radar, which includes four bands of interest including the X band, which is approximately 10.50 GHz to 10.55 GHz; the Ku band, which is approximately 13.40 GHz to 13.50 GHz; the K band, which is approximately 24.05 GHz to 24.25 GHz; and, the Ka band, which is approximately 33.40 GHz to 36.00 GHz.

The first processing stage 102 comprises two independent input stages 110, 112, corresponding to a front channel input stage 110 and a rear channel input stage 112. The use of two input stages 110, 112 allows the detector 100 to determine the direction of origin of detected signals. As the input stages 110, 112 are substantially the same, only the input stage 110 will be illustrated and described in detail. Moreover, while two input stages 110, 112 are illustrated, other arrangements may be utilized, including the use of a single input stage.

The exemplary input stage 110 includes generally, an antenna 114, such as a wide band microwave horn, a band splitting section 116, a first stage mixer section 118 and a first stage output section 120. Wide band electromagnetic signals received by the antenna 114 are coupled to the band splitting section 116. The band splitting section 116 splits the received electromagnetic energy into a first signal path 122 and a second signal path 124, e.g., by using a diplexer. In the illustrated embodiment of the radar detector 100, the signals from the antenna 114 that travel along the first signal path 122 couple to the input of a band reject filter 126, which passes frequencies in the X band and the Ku band and rejects frequencies in the K band and Ka band. For example, the band reject filter 126 may reject frequencies extending from approximately 24 gigahertz (GHz) to approximately 36 GHz. The output of the band reject filter 126 is coupled to first path preamplifier circuitry 128, which passes an amplified and filtered signal to a first path bandpass filter 130. The first path bandpass filter 130 passes frequencies in the X band and Ku band, e.g., from approximately 10.50 GHz to approximately 13.50 GHz, to the first stage mixer section 118.

The signals from the antenna 114 that travel along the second signal path 124 couple to the input of a high pass filter 132, which passes signals in the K band and the Ka band, e.g., signals above approximately 24.05 GHz, and rejects signals having frequencies below the K band. The output of the high pass filter 132 also couples to the first stage mixer section 118.

The first stage mixer section 118 comprises a first mixer 134 that is driven by a first local oscillator 136. The first local oscillator 136 comprises a voltage controlled oscillator 138 (VCO) that outputs a swept local oscillator signal that is amplified by a local oscillator preamplifier 140. The output of the local oscillator preamplifier 140 is filtered by a local oscillator bandpass filter 142, and the output of the local oscillator bandpass filter 142 is coupled to the first mixer 134. The signal conditioning and control circuitry 108 provides a control voltage to the VCO 138, e.g., along a first local oscillator control line 144 such that the VCO output sweeps across a desired range of frequencies. For example, in the illustrated embodiment of the radar detector 100, the output of the VCO 138 can be swept from approximately 15.160 GHz to approximately 13.975 GHz. As will be described in greater detail below, the first mixer 134 provides a first mixer output, designated $F_{1out}$, which shifts the frequency of the received electromagnetic signal to a first intermediate frequency range. That is, the first mixer 134 converts power from the antenna 114 at frequencies within the X band, Ku band, K band and Ka band (collectively designated herein as $F_{RF}$) into power at a first intermediate frequency range, e.g., frequencies below approximately 6 GHz, based upon the frequency of the first local oscillator 136 (designated herein as $F_{LO1}$) according to the expressions $F_{1OUT}=F_{LO1}+F_{RF}$ and $F_{1OUT}=F_{LO1}-F_{RF}$.

The output of the first mixer 134 is processed by the first stage output section 120, which comprises a first stage low pass filter 146 coupled to first stage output preamplifier circuitry 148. In the illustrated embodiment of the radar detector 100, the low pass filter 146 is designed with a corner frequency of approximately 6 GHz.

In general, the first processing stage 102 shifts the filtered output of the antenna 114 into an intermediate frequency range, which is output to the second processing stage 104 of the radar detector 100. As noted above, the bands of interest, i.e., the X band, the Ku band, the K band and the Ka band span non-overlapping frequency ranges. As such, the first processing stage 102 must be able to translate each band to the appropriate intermediate frequency range. In many conventional radar detecting devices, this is accomplished by providing multiple local oscillators that are switched in a programmed sequence by a corresponding controller to sweep each of the bands of interest. However, in the illustrated detector 100, a single local oscillator is utilized as explained below.

The first mixer 134 may comprise for example, a subharmonic mixer, thus allowing a single swept local oscillator signal to scan the X band, Ku band, K band and Ka band. For example, the subharmonic mixer may be implemented using a pair of antiparallel diodes configured such that a first end of the antiparallel diodes is coupled to the output of the first path band bandpass filter 130, the output of the local oscillator bandpass filter 142 and the input of the first stage lowpass filter 146. A second end of the antiparallel diodes is coupled to the second path high pass filter 132. Under this arrangement, the nonlinear conductance of the antiparallel diodes results in a doubling (second harmonic) of the local oscillator frequency when scanning the signals passed to the first mixer 134 along the second signal path 124. The frequency doubling is due to the antiparallel diodes of the first mixer 134 conducting on alternate half-cycles of the local oscillator signal from the first local oscillator 136.

The first mixer 134 may be operated in a fundamental mode or in a harmonic mode. When operating in the fundamental mode, the first mixer 134 scans the signals over the X and Ku bands from the first signal path 122. When sweeping the X and Ku bands, the VCO 138 of the first local oscillator 136 is controlled by the signal conditioning and control circuitry 108 to sweep from approximately 15.160 GHz to approximately 15.090 GHz. The local oscillator frequency is not doubled in the fundamental mode because the first signal path 122 is coupled to the same side of the first mixer 134 antiparallel diodes as the local oscillator signal.

Comparatively, when operating in the harmonic mode, the first mixer 134 scans signals over the K and Ka bands from the second signal path 124. When sweeping the K and Ka bands, the VCO 138 of the first local oscillator 136 is controlled by the signal conditioning and control circuitry 108 to sweep from approximately 15.160 GHz to approximately 14.310 GHz. The local oscillator frequency is doubled in the harmonic mode because the second signal path 124 is coupled to the opposite side of the first mixer 134 antiparallel diodes as the local oscillator signal. Thus, the local oscillator frequency is inherently doubled due to the nature of the subharmonic mixer to yield injection of first local oscillator 136 signal into the first mixer 134 having frequencies which are swept from 30.320 GHz to 28.620 GHz.

Additionally, the VCO may further be swept down to approximately 13.975 GHz to yield injection of the first local oscillator signal 136 into the first mixer 134 down to 27.95 GHz to look for signals that may fall outside of the X, Ku, K and Ka bands. Sweeping outside of the X, Ku, K and Ka bands is performed to distinguish nuisance signals from signals of interest as will be described in greater detail below.

The input stage 110 further comprises band switching circuitry 150 to select which of the X, Ku, K and Ka bands are to be processed and considered by subsequent circuitry. That is, the band switching circuitry 150 designates the fundamental mode of operation, wherein the X band and Ku band signals are processed along the first signal path 122 for mixing with the first local oscillator 136, or the band switching circuitry 150 designates the harmonic mode of operation, wherein the K band and Ka band signals are processed along the second signal path 124 for mixing with the first local oscillator 136.

The band switching circuitry 150 comprises a band switch control line 152 from the signal conditioning and control circuitry 108 that couples to the first path preamplifier circuitry 128 and to the output of the low pass filter 146 through a first control resistor 154. The harmonic and fundamental modes are selected by the signal conditioning and control circuitry 108 by selectively applying a direct current (dc) signal on the band switch control line 152. When the dc signal is applied, the fundamental mode of operation is selected and the first path preamplifier circuitry 128 is enabled. The dc signal further passes through the first control resistor 154 and through the first stage low pass filter 146 to bias one side of the antiparallel diodes that make up the first mixer 134.

The dc bias upsets the balance of the antiparallel diodes so that one of the diodes is forward biased and the other diode is reversed biased. This dc bias causes the first mixer 134 to mix more efficiently with the fundamental of the applied first local oscillator 136 signals rather than the second harmonic of the signals generated by the first local oscillator 136. Thus, the first mixer 134 scans for signals on the first signal path 122, corresponding to the X and Ku bands. When the dc bias is not applied, the harmonic mode of operation is selected, the first path preamplifier circuitry 128 is disabled and no dc bias is applied to the antiparallel diodes. Under this configuration, signals on the second signal path 124 are scanned, corresponding to the K and Ka bands.

In the input stage 110, the band reject filter 126 may be implemented by the diplexer of the first stage band splitting section 116, or as separate processing circuitry. Similarly, the second path high pass filter 132 may be implemented by the diplexer or as separate processing circuitry. Moreover, the input stage 110 may comprise a passive multiplexer 156 that includes, for example, one or more of the band reject filter 126, the first path bandpass filter 130, the second path high pass filter 132, the local oscillator bandpass filter 142 and the first stage lowpass filter 146.

In the illustrated and described topology of the input stage 110, the first path bandpass filter 130 provides attenuation of the local oscillator signals from being passed back to, and broadcast by the antenna 114 through the first signal path 122. The first mixer 134 provides additional attenuation of any signals which may feedback toward the input of the preamplifier circuitry 128 along the first signal path 122, which also reduces the possibility of oscillation of the first path preamplifier circuitry 128. Additionally, the second path high pass filter 132 substantially prevents local oscillator signals from being passed to and broadcast from the antenna 114 through the second signal path 124 so that the local oscillator drive is delivered substantially to the first mixer 134, e.g., antiparallel diodes, with relatively little local oscillator power being delivered to the antenna 114. The input stage 110 further provides a very direct and low loss path for K band and Ka band signals from the antenna 114 to the first mixer 134, which is believed to result in a favorable noise figure on the K band and Ka band.

The second processing stage 104 comprises a first intermediate frequency amplifier 158, a second stage mixer 160, a second local oscillator 162 controlled by second local oscillator control signals 164 from the signal conditioning and control circuitry 108, second stage preamplifier circuitry 166 and a second stage bandpass filter 168. The first stage output preamplifier circuitry 148 outputs a first intermediate frequency signal, designated herein as $F_{IF1}$, which is coupled to the input of the first intermediate frequency amplifier 158 as illustrated. The first intermediate frequency amplifier 158 may be omitted from the detector 100 although some sensitivity may be lost. Also, the first intermediate frequency amplifier 158 can be bypassed or a separate device handling the second intermediate frequency can be provided.

Signals from the output of the first intermediate frequency amplifier 158 are passed to the second stage mixer 160. The second stage mixer 160 mixes the signals from the first intermediate frequency amplifier 158 ($F_{IF1}$) with a signal from the second local oscillator 162, designated as $F_{LO2}$, to produce a second stage mixer 160 output $F_{2OUT}$ according to the expressions $F_{2OUT}=F_{LO2}+F_{IF1}$ and $F_{2OUT}=F_{LO2}-F_{IF1}$. The local oscillator signals generated by the second local oscillator 162 have a frequency of approximately 5.325 GHz in the illustrated embodiment when the second local oscillator 162 is active. Signals from the second stage mixer 160 are passed to the second stage preamplifier circuitry 166 and the output of the second stage preamplifier circuitry 166 is filtered by the second stage bandpass filter 168. In the illustrated embodiment, the second stage bandpass filter 168 is constructed to pass signals in a band that is centered at approximately 725 MHz. The second preamplifier circuitry may further be optimized for signals around 725 MHz.

During operation of the radar detector 100, the second stage 104 is utilized to detect the X, K and Ka bands and is disabled for detecting the Ku band as will be described in greater detail herein. When the second stage 104 is active however, noise at 725 MHz may bleed through the second stage mixer stage overlaying the desired signals and degrading the noise figure by raising the noise floor. In particular, a 725 MHz second intermediate frequency amplifier 166 and corresponding second stage bandpass filter 168 in conjunction with the 5.325 GHz second local oscillator 162 signal lead to potential reception of signals at 4.600 GHz and 6.050 GHz, i.e., 5.325 GHz±725 MHz. One of these responses may be suppressed so that the radar detector 100 noise figure is not degraded. Each of these two intermediate frequency responses, 4.600 GHz and 6.050 GHz, combine with the first local oscillator signals from the first local oscillator 136 to yield a total of four receive frequencies, i.e., first local oscillator 136 ±4.600 GHz and first local oscillator 136 ±6.050 GHz.

Figure 2:
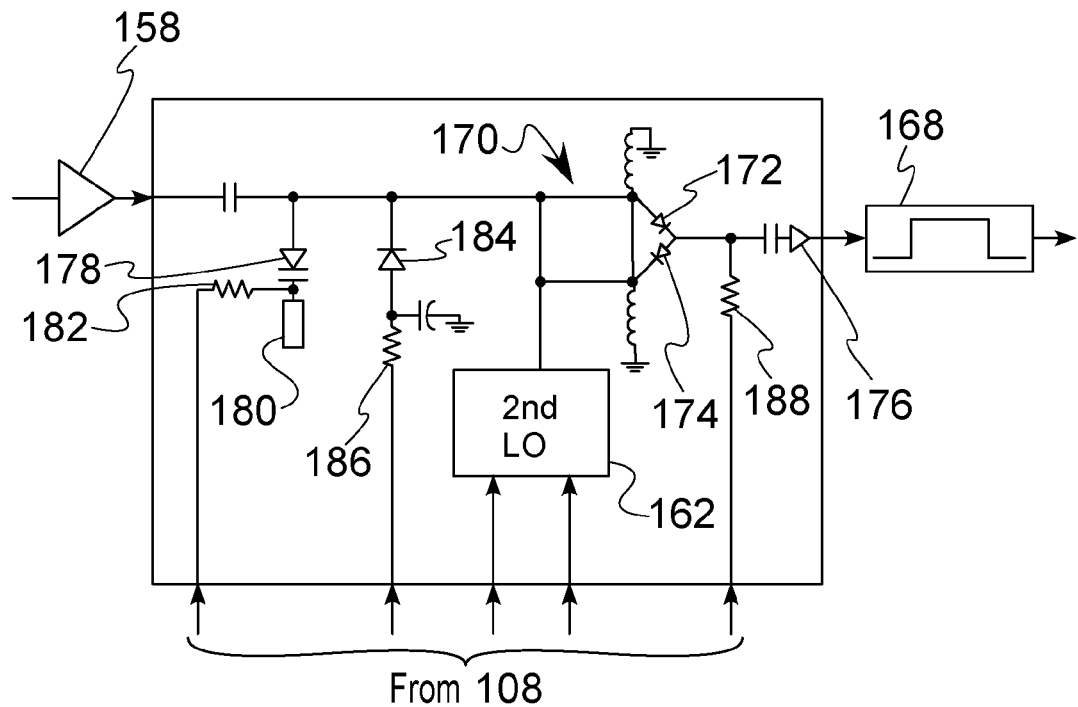
FIG. 2 is a schematic block diagram of the second stage mixer of the detector of FIG. 1.

With brief reference to FIG. 2, the second stage mixer 160 may be implemented so as to provide sideband suppression. As is schematically illustrated, the second stage mixer 160 comprises a 90 degree hybrid circuit 170, a first diode 172 and a second diode 174 which together serve as the second stage mixer. Sideband suppression circuitry comprises a varactor 178 which is tuned by a floating stub 180 and a dc bias or signal suppression signal applied by the signal conditioning and control circuitry 108, e.g., via a conductor through a second control resistor 182 to select the desired sideband and suppress noise in the undesired image sideband. Thus, through sideband suppression, the 4.600 GHz or 6.050 GHz response is selected such that two sweeps of the first local oscillator 136 are required, one sweep for scanning the K band and the lower portion of the Ka band and a second sweep for scanning the upper portion of the Ka band. A noise suppression circuit may also be provided, for example, comprising a PIN diode 184. The PIN diode 184 is forward biased through a third control resistor 186 during all modes employing 5.325 GHz mixing to shunt the 725 MHz noise.

During Ku band operation, the Pin diode 184 is reverse biased so that the 725 MHz signals can be processed. Moreover, for Ku band reception, the mixing operations of the second stage mixer 160 are stopped by disabling the second local oscillator 162, e.g., by providing current through a fourth control resistor 188 to forward bias the diode and thereby bypass the second stage mixer 160. The desired signal is then converted to 725 MHz and is passed through the forward biased diode to the second stage bandpass filter 168. The state of the sideband suppression signal as controlled by the second control resistor 182 is generally irrelevant during the Ku band scanning. It is noted, however, that one or the other of the two states of the sideband suppression circuitry may be preferred dependent on the Ku band tuning characteristics if that state enhances Ku band tuning.

The circuitry beyond the second processing stage 104 forms detector circuitry for detecting electromagnetic signals in the scanned radar bands. The output of the bandpass filter 168, designated $F_{IF2}$, couples the second processing stage 104 to the third processing stage 106. The third processing stage 106 includes a single sideband down converter 190, e.g., a third stage mixer 192, a corresponding third local oscillator 194 controlled by third local oscillator control signals 196 from the signal conditioning and control circuitry 108 and a third stage bandpass filter 198. The third stage mixer 192 mixes the signals from the second stage bandpass filter 168 with a signal from the third local oscillator 194, designated as $F_{LO3}$, to produce a third stage mixer 192 output $F_{3OUT}$. The local oscillator signal generated by the third local oscillator 194 has a frequency of approximately 725.3 MHz in the illustrated embodiment when the third local oscillator 194 is active.

In the illustrated embodiment, the third stage bandpass filter 198 is constructed to pass signals in a band that is centered at approximately 300 kilohertz (Khz). The output of the third stage bandpass filter 198 is coupled to an amplitude modulation (AM) and frequency modulation (FM) detector circuit 200, sometimes referred to as a discriminator or demodulator circuit, which operates in a manner disclosed in U.S. Pat. No. 5,068,663, which is assigned to the same assignee as the present application and is incorporated herein by reference. The FM output or frequency demodulation detection signal from the AM and FM detector circuit 200 is passed to the third stage local oscillator to lock the radar detector 100 onto incoming electromagnetic signals and also to signal the signal conditioning and control circuitry 108 of detected radar signals, e.g., via a control line 201.

Upon detecting a radar signal in one of the X, Ku, K or Ka bands, a determination is made whether that signal is a nuisance signal, which will be explained in greater detail below. If the detected radar signal is not considered a nuisance signal, the signal conditioning and control circuitry 108 activates alarm and/or display circuitry which can be audible, visual, etc. For example, as schematically illustrated the detector comprises an audible alarm 202, having one or more sounds that can be controlled by the control and signal processing circuitry 108. Further, a display 204 comprises at least alarm display indicia 204A, which can be a counter, arrow, LED or other visual indicator that can be selectively turned on, off, modified or otherwise manipulated. The display 204 further comprises false alarm display indicia 204B, such as a special designation to temporarily indicate that a previously perceived valid signal has been determined to be a nuisance signal.

To further clarify the various operating ranges of the illustrated detector 100, reference should now be made to Table 1 which details the frequencies at various processing stages of the detector 100. Column 1 is a reference number. Column 2 identifies the sweep range of the first local oscillator 136 to sweep an associated one of the X, Ku, K and Ka bands. Column 3 defines the effective first local oscillator injection frequency based upon control of the subharmonic mixer. Column 4 provides the formula used to compute the frequency range of electromagnetic signals that are swept and detected in the corresponding table row. Column 5 identifies exemplary frequency range values for the corresponding table row based upon the detector 100 illustrated with regard to FIG. 1. Column 6 identifies the band of coverage of the frequency range in Column 5. Column 7 indicates which of the side lobes is selected in the second processing stage 104 and Column 8 indicates the second intermediate frequency of the filtered electromagnetic signals.

TABLE 1

Receiver Frequency Scheme

| Ref. | $F_{LO1}$ | $F_{MIXER1}$ | $F_{RF}$ Function | $F_{RF}$ | Coverage | 1st IF | 2nd IF |
|---|---|---|---|---|---|---|---|
| 1) | 15.160 → 14.310 | 30.320 → 28.620 | $F_{RF} = F_{MIXER1} + F_{LO2} + F_{LO3}$ | 36.370 → 34.670 | Top of Ka | 6.050 | 0.725 |
| 2) | 15.160 → 14.310 (13.975) | 30.230 → 28.620 (27.95) | $F_{RF} = F_{MIXER1} + F_{LO2} - F_{LO3}$ | 34.920 → 33.220 (32.550) | Bottom of Ka (and below Ka) | 4.600 | 0.725 |
| 3) | 15.160 → 14.310 (13.975) | 30.320 → 28.620 (27.95) | $F_{RF} = F_{MIXER1} - F_{LO2} + F_{LO3}$ | 25.720 → 24.020 (23.35) | K (and below K) | 4.600 | 0.725 |
| 4) | 15.160 → 14.310 | 30.320 → 28.620 | $F_{RF} = F_{MIXER1} - F_{LO2} - F_{LO3}$ | 24.270 → 22.570 | Interference & K | 6.050 | 0.725 |
| 5) | 15.160 → 15.090 | 15.160 → 15.090 | $F_{RF} = F_{MIXER1} + F_{LO2} + F_{LO3}$ | 21.210 → 21.140 | Of no interest | 6.050 | 0.725 |
| 6) | 15.160 → 15.090 | 15.160 → 15.090 | $F_{RF} = F_{MIXER1} + F_{LO2} - F_{LO3}$ | 19.760 → 19.690 | Of no interest | 4.600 | 0.725 |
| 7) | 15.160 → 15.090 | 15.160 → 15.090 | $F_{RF} = F_{MIXER1} - F_{LO2} + F_{LO3}$ | 10.560 → 10.490 | X | 4.600 | 0.725 |
| 8) | 15.160 → 15.090 | 15.160 → 15.090 | $F_{RF} = F_{MIXER1} - F_{LO2} - F_{LO3}$ | 9.110 → 9.040 | Of no interest | 6.050 | 0.725 |
| 9) | 14.225 → 14.125 | 14.225 → 14.125 | $F_{RF} = F_{MIXER1} + F_{LO3}$ | 14.950 → 14.850 | Of no interest | 0.725 | |
| 10) | 14.225 → 14.125 | 14.225 → 14.125 | $F_{RF} = F_{MIXER1} - F_{LO3}$ | 13.500 → 13.400 | Ku | 0.725 | |

$F_{Lo1}$ is the first mixer local oscillator frequency, which can be swept from approximately 15.160 GHz to approximately 13.975 GHz.
$F_{Lo2}$ is the second stage mixer local oscillator frequency (5.325 GHz).
$F_{Lo3}$ is the second intermediate amplifier frequency (725 MHz).

As noted in Table 1, in the process of covering the 2.6 GHz wide Ka band, the receiver also scans other frequencies where signals may be generated and these signals may provide useful information in discriminating between legitimate signals and nuisance signals as will be described in greater detail below. Alternatively, such signals may be unwanted and ultimately be ignored. The ability to ignore these unwanted signals is performed by a combination of frequency calibration of the first local oscillator 136 as disclosed in referenced U.S. Pat. No. 5,068,663; and, by being able to identify the active mixer sidebands as will now be described.

In operation, it is desirable to determine which of the X, Ku, K and Ka bands contains a detected signal of interest. To differentiate the various bands, the circuit AM and FM detector circuit 200 generates a frequency demodulation detection signal as its output. If a modulation signal, such as a 500 hertz sine wave, is applied for example to the first local oscillator 136, the modulation will be superimposed upon the received signal and will appear at the output of the AM and FM detector circuit 200. The detected modulation will be either in phase or 180 degrees out of phase with the applied modulation, depending on whether the signal path was the upper sideband or the lower sideband of the second stage mixer 160. Analogous results occur if modulation is applied to the second local oscillator 162. Thus, if a modulation signal, such as a 500 hertz sine wave, is applied to the second local oscillator 162, the modulation will be superimposed upon the received signal and will appear at the output of the AM and FM detector circuit 200 either in phase or 180 degrees out of phase with the applied modulation, depending on whether the signal path was the upper sideband or the lower sideband of the second stage mixer 160.

Thus, by applying orthogonal modulation of the first and second local oscillators 136, 162, synchronous quadrature correlation of the detected frequency modulation may be utilized to yield either a positive or a negative correlation with each local oscillator 136, 162. As schematically illustrated, the detector 100 conceptually includes modulation circuitry 206, which includes a first summer 208, a second summer 210 and phase shift circuitry 212. The signal conditioning and control circuitry 108 outputs a modulation signal 214, e.g., a signal corresponding to a 500 Hz signal which is added to the first and second local oscillator signals via the respective first and second summers 208, 210. The modulation signal 214 is further phase shifted 90 degrees, e.g., by phase shift circuitry 212, before being summed by the first summer 208 with the first local oscillator control signal. Alternatively, the modulation signal 214 may be coupled to the respective first and second local oscillators 136, 162 along separate lines, or by using alternative coupling circuitry.

Figure 3:
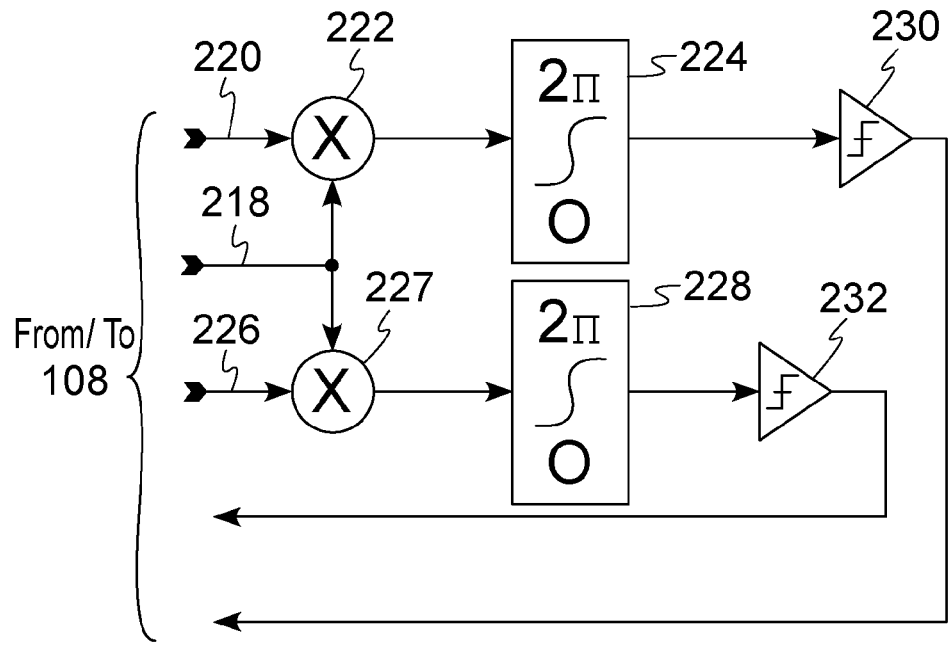
FIG. 3 is a schematic block diagram illustrating quadrature correlation for the resolution of frequency ambiguities in the detector of FIG. 1.

A hardware implementation of quadrature correlation is conceptually illustrated in the schematic block diagram of FIG. 3. Correlated detection is performed by multiplying or mixing the detected FM signal 218 with the 500 Hz signal 220 generated by the signal conditioning and control circuitry 108 in a first mixer circuit 222 and integrating the result over one or more integer periods of the modulation in a first integrator circuit 224. Correlated detection is further performed by mixing the detected FM signal 218 in a second mixer 227 with the 500 Hz signal 226, that has been shifted by −90 degrees and integrating the result over one or more integer periods of modulation in a second integrator circuit 228. The output signals from the integrator circuits 224, 228 are passed through respective threshold circuits 230, 232 to generate slope signals, each having a +1 or −1 value. The output of the threshold circuits 230, 232 are sent to the signal conditioning and control circuitry 108 and define a two bit value that encodes which one of the X, K or Ka bands is associated with that value. For the Ku band, the output of the threshold circuit 230 is sufficient to determine the active signal path.

The quadrature modulation arrangement permits characterization of both frequency conversions simultaneously. The synchronous quadrature correlation for the radar detector 100 may be implemented in hardware and/or software, e.g., by digitizing the detected FM signal and performing the multiplications and integrations numerically in software within a microprocessor of the signal conditioning and control circuitry 108. Other modulation techniques can also be utilized. For example, modulation signals having different frequencies can be applied to one or both mixers.

Discrimination of False Signals

The radar detector 100 suppresses nuisance alerts, e.g., alerts based upon detected signals other than police radar, such as signals leaked by other radar detectors. The radar detector 100 can detect and suppress nuisance alerts in a number of different ways, each of which may be applied alone, or in combination with other nuisance detection techniques as set out more fully herein.

Conventional radar detecting devices have been known to provide a plurality, i.e., two or more local oscillators that are sequentially switched in an input stage mixer for scanning the X, K and Ka bands. For example, a first conventional local oscillator may have a frequency of approximately 11.5 GHz to sweep the X and K bands. A second conventional local oscillator may have a frequency of approximately 16.3 GHz to sweep the lower portion of the Ka band and a third conventional local oscillator may have a frequency of approximately 16.9 GHz to sweep the upper portion of the Ka band. The first, second and third conventional local oscillators are referred to herein as companion oscillators as they are each associated with the same detector.

The companion oscillators are switched in turn, to scan their respective bands under control of a corresponding processor. Under such a scheme, the conventional radar detecting device will leak energy that switches between the first, second and third conventional local oscillators and their corresponding harmonic spectra. In the present example, the third harmonic of the first conventional local oscillator, approximately 34.5 GHz, and the second harmonic of the third conventional local oscillator, approximately 33.8 GHz, fall within the Ka band. Moreover, the second harmonic of the second conventional local oscillator (approximately 32.6 GHz) falls outside of the K band and the Ka band. Thus, as the companion oscillators are switched on and off, leakage signals or bursts will appear to switch in and out of the Ka band in a pattern. Such conventional local oscillators will also be referred to herein as nuisance local oscillators to refer to the local oscillators from a conventional radar detecting device that leak signals detectable by the detector 100.

Figure 4:
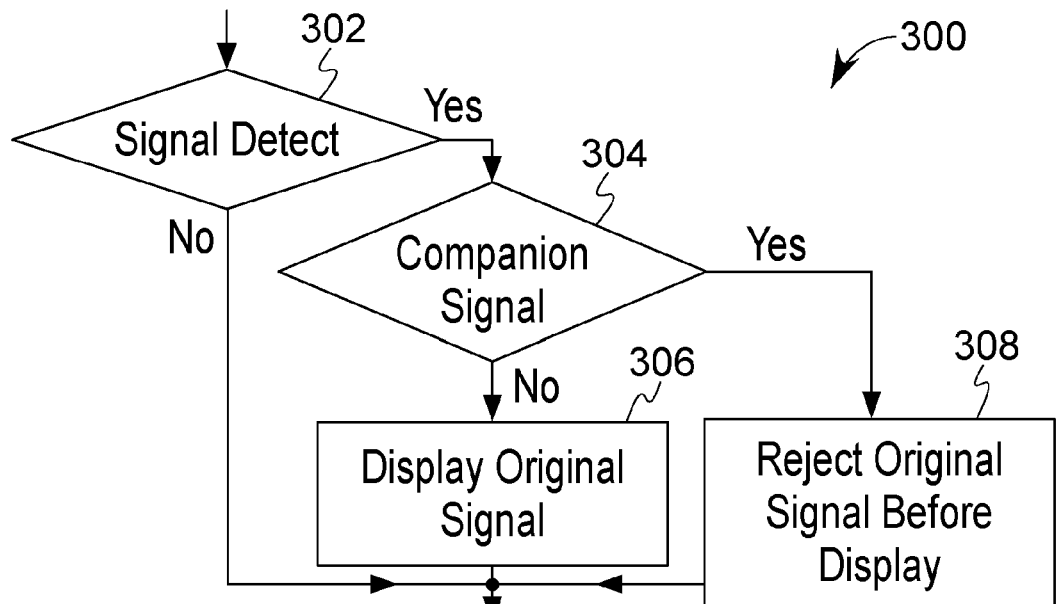
FIG. 4 is a flow chart illustrating a method for determining that a detected in-band signal is a nuisance signal.

Referring to FIG. 4, a flow chart illustrates a method 300 to determine whether a detected signal is a nuisance signal. The method illustrated in FIG. 4 may be implemented by the detector 100, including the control and signal conditioning circuitry 108 and memory 109. The method comprises detecting a first signal in a band of interest at 302. A band of interest may comprise for example, the Ka band in the above example, but may include any other frequency range. Once the first signal is detected, a determination is made at 304 whether a companion signal is also detected. The companion signal may be detected, for example, by sweeping a frequency range or otherwise checking one or more frequencies to look for a companion signal that can be interpreted as being derived from an associated nuisance local oscillator other than a nuisance local oscillator that generated the first signal.

Assume that a potential nuisance signal is detected in the Ka band. If that signal was actually a harmonic of a nuisance local oscillator leaked from a nearby radar detector, that leaky detector may also comprise one or more additional nuisance local oscillators that each also leak when active. For example, a nearby leaky detector may comprise three nuisance local oscillators including a first nuisance local oscillator at approximately 11.5 GHz, a second nuisance local oscillator at approximately 16.3 GHz and a third nuisance local oscillator at approximately 16.9 GHz. When the third nuisance local oscillator is active, it is possible that enough power will be leaked at its second harmonic (33.8 GHz) that a signal will be detected in the Ka band.

However, that same leaky detector will also leak a companion signal, such as the 16.3 GHz nuisance local oscillator, which may leak enough power at its second harmonic (32.6 GHz) that a signal can be detected by sweeping below the Ka band. For example, by sweeping the first local oscillator 136 from approximately 14.020 GHz to 13.975 GHz, e.g., as shown in the sweep range down to 13.975 listed in Row 2 of Table 1, and operating the first mixer 134 in harmonic mode corresponding to an injection of the first local oscillator signal 136 into the first mixer 134 of 32.640 GHz to 32.550 GHz, the 32.6 GHz second harmonic of the second nuisance local oscillator can be detected if the second nuisance local oscillator is active.

If a companion signal is not also detected, then the detected signal is identified as a presumptively valid signal, and an appropriate action is taken at 306, e.g., an alert is provided by sounding an alarm, updating a display on the detector surface etc. However, if a companion signal is detected, the detected signal is categorized as a nuisance signal at 308 and is rejected before updating a display, e.g., without sounding a warning alert, etc. Thus, an alarm can be suppressed by observing that a 32.6 GHz leakage burst signal is a companion signal that is alternating with a 33.87 GHz leakage burst signal that is being detected in the Ka band. In the present example, an out of band companion signal is used to characterize an in-band signal as a nuisance signal. The above-identified frequency values are merely exemplary and other frequencies or ranges of frequencies may be considered.

In the above-example, the first signal detected at 302 was analyzed to determine whether the first signal was a nuisance signal before taking an appropriate action at 306 or 308. In this example, the second harmonic (32.6 GHz) of a suspected second nuisance local oscillator at 16.3 GHz and the second harmonic (33.8 GHz) of the third nuisance local oscillator at 16.9 GHz may each be detected in the same sweep cycle by sweeping just outside of the Ka band as noted above. However, depending upon a number of factors, such as the manner in which the leaking local oscillators are switched and the cycle time of a sweep of the detector 100, it may take one or more sweep cycles by the detector 100 to detect both the in-band signal harmonically related to a leaky nuisance local oscillator and one or more of its corresponding leaky companion signals.

It is also possible that a third harmonic (34.5 GHz) of the first nuisance local oscillator at 11.5 GHz may also be detected as a Ka band signal along with the second harmonic (33.8 GHz) of the third nuisance local oscillator. Thus, in one example, two in-band signals can be used to discriminate both signals as false alarms by detecting a pattern of burst signals from each of the in-band signals. Moreover, by detecting the second harmonic of the second nuisance local oscillator at 16.3 GHz, one or more in-band signals can be identified as false alarms. For example, if the detector 100 identifies a pattern comprised of leaky burst signals alternating at 34.5 GHz (third harmonic of the first nuisance local oscillator), 32.6 GHz (second harmonic of the second nuisance local oscillator) and 33.8 GHz (second harmonic of the third nuisance local oscillator), then the detected harmonics from the first and third nuisance local oscillators which are detected in the Ka band can be identified as false alarm signals. The relative strengths of the various harmonic content of nearby leaky nuisance local oscillators, the rate at which they are switched in a pattern and the sweep rate of the detector 100 may all affect which harmonics are detected in a given sweep.

Moreover, the detector 100 may optionally sweep all bands before updating its display and/or warnings at 306. As such, it is possible to detect a companion signal to confirm a false alarm either before or after an in-band signal has been detected, e.g., where the companion signal is alternating in time with the detected in-band signal.

In the above examples, a pattern is detected where at least one in-band signal is detected along with a signal that is derived from a companion local oscillator. As such, a pattern may comprise the detection of two or more signals, which may be detected in a single sweep cycle, or in multiple sweep cycles, e.g., by tracking and maintaining a history of detected signals. The pattern may also comprise a switching pattern of the leaky local oscillators that is detectable as a repeating pattern. The detection of the repeating nature of the pattern may provide a greater confidence interval that the detected signals are derived from companion leaky local oscillators. However, the detection of a pattern characterized by a single occurrence of the two or more signals believed to be derived from a companion leaky local oscillator may provide faster response of the detector 100 to the detected signals.

The above examples were merely exemplary of the various companion signals that can be detected in order to characterize an in-band signal as a nuisance signal. Other schemes may alternatively be implemented. For example, keeping with the above example where a third nuisance local oscillator at 16.9 GHz leaks a second harmonic of 33.8 GHz in the Ka band, an alternative companion signal that may be detected with the above scheme is the second harmonic of the first nuisance local oscillator. That is, the leaky first nuisance local oscillator (11.5 GHz) will leak a second harmonic at 23 GHz, which can be detected by the sweep designated along line 4 of Table 1 above.

The relative sweep rate and sensitivity of the detector 100, and the switching rate and the signal strength of various companion signals and their associated harmonic spectra from nearby leaky devices, may all affect when a companion signal is detected. As such, several checks for companion signals may be performed to confirm a false alarm of a detected in-band signal, e.g., to identify a first occurrence of a companion signal, or to identify a detected pattern as a repeating cyclical pattern.

Figure 5:
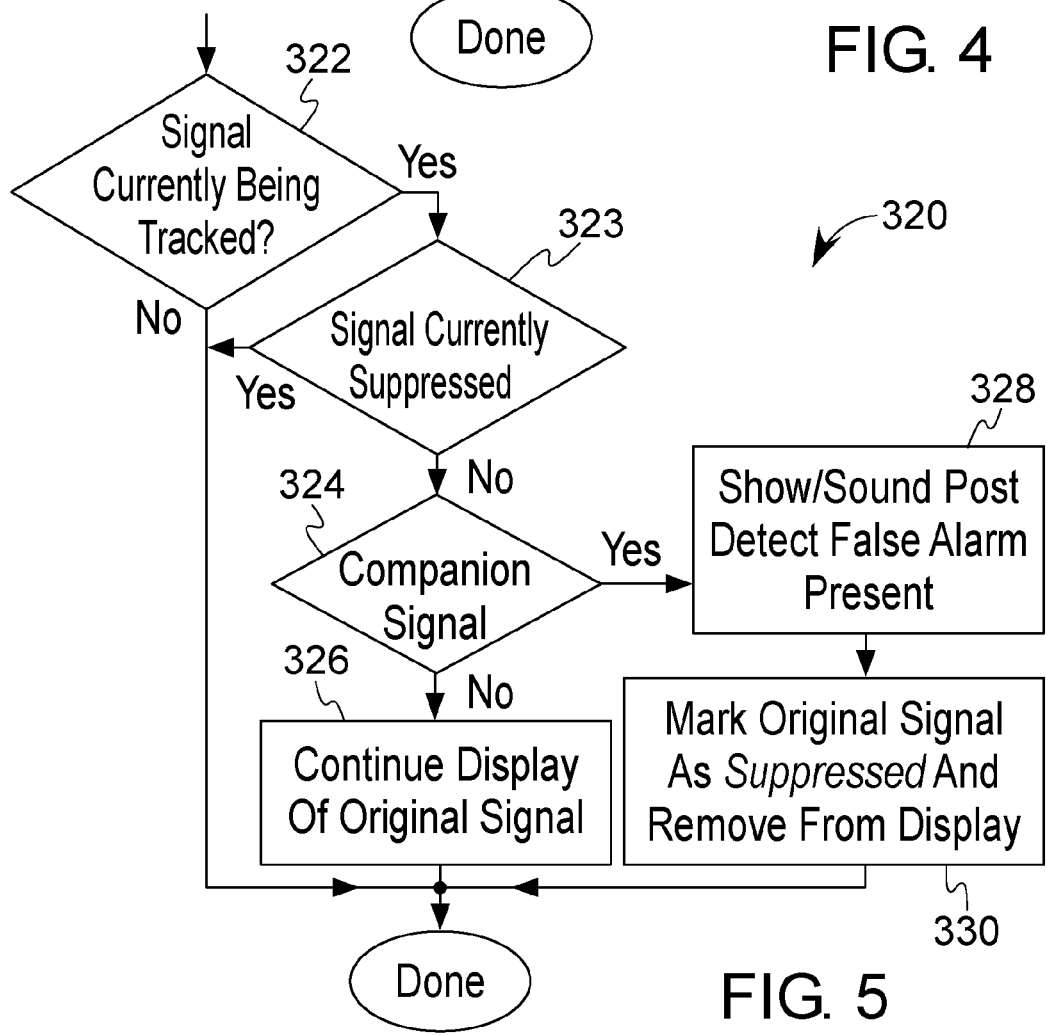
FIG. 5 is a flow chart illustrating a method for canceling an alarm based upon a determination that a previously detected in-band signal is a nuisance signal.

With reference to FIG. 5, a method 320 illustrates an exemplary manner for addressing a potential nuisance signal that was previously detected in a band of interest where a companion signal was not concomitantly detected. The method illustrated in FIG. 5 may be implemented by the detector 100, including the control and signal conditioning circuitry 108 and memory 109. At 322, a determination is made as to whether an in-band signal is being tracked. For example, in a previous sweep of the X, K and Ka bands, an in-band signal may be detected where no companion signal is also detected. Under such an arrangement, the in-band signal is marked as a valid signal and an alert, e.g., visual and/or audible alarm may have been sounded, e.g., such as described with reference to 306 in FIG. 4.

Figure 6:
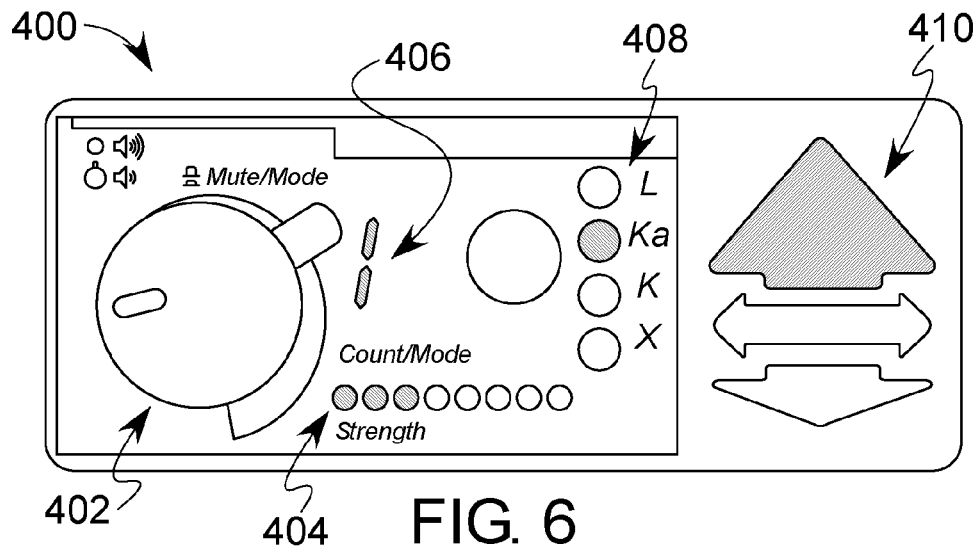
FIG. 6 is a block diagram of an exemplary display for the detector of FIG. 1 illustrating the detection of a Ka band signal.

With brief reference to FIG. 6, a front panel 400 of the detector 100 includes a display area having one or more user-adjustable controls 402, a strength indicator 404, a count/mode indicator 406, a band indicator 408 and a direction indicator 410. The user sets the user-adjustable controls 402 to user-defined preferences, e.g., to control the volume of audible alarms, to control the sensitivity of the antenna, etc.

The strength indicator 404 provides a visual representation of the relative strength of received signals to the user. The count/mode indicator 406 provides a count of the number of detected signals and also provides operating mode information to the user. The band indicator 408 provides the radar band of the detected signals and the direction indicator 410 illustrates the direction of the detected signals. For example, the up arrow may correspond to a signal detected by the front input stage 110 and the down arrow may indicate a signal detected by the rear input stage 112 as described with reference to FIG. 1. The display 400 is merely illustrative and other features or manners of display may be implemented.

As FIG. 6 illustrates, a first alert is provided for a signal that has been detected in the Ka band as represented by a measure of signal strength, e.g., about 3 out of 8, in the strength indicator 404, the numeric "1" that appears in the count/mode indicator 406, the activation of the visual display adjacent to the Ka indicia in the band indicator 408 and the activation of the up arrow display in the direction indicator 410. Optionally, an audible alarm may also be sounded such as by sounding the alarm 202 described with reference to FIG. 1.

However, it is still possible that the in-band signal is actually a false alarm. For example, an in-band signal may be detected in the Ka band, e.g., at 33.8 GHz. However, because of sweep rate of the detector 100, the switch rate of the various nuisance local oscillators of a nearby leaky radar detector, the relative signal strengths of the various companion signals and/or their harmonics, the companion signal necessary to confirm a false alarm may not have been previously detected with sufficient confidence to invalidate the warning. As such, the in-band signal is tracked for each sweep cycle, e.g., using a table in a memory 109 of the signal conditioning and control circuitry 108 described with reference to FIG. 1.

Figure 8:
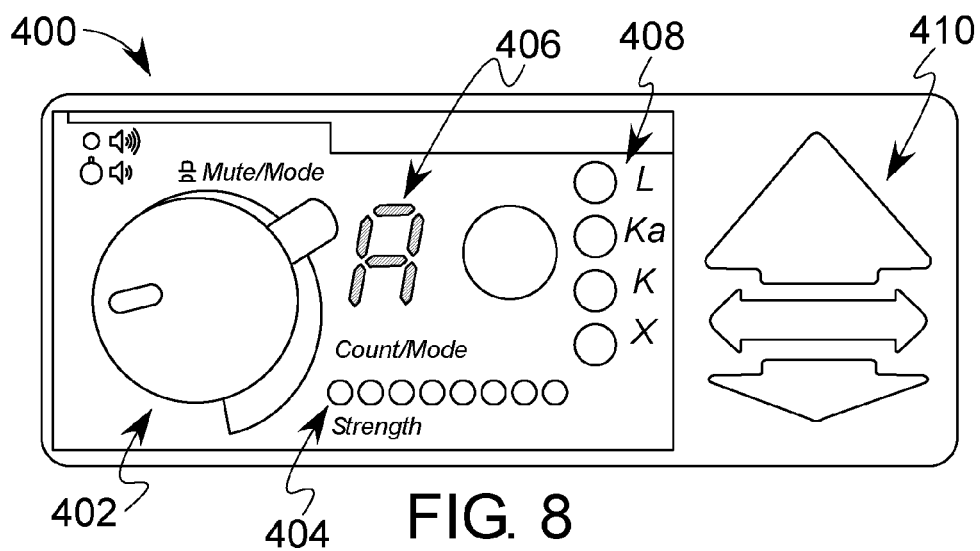
FIG. 8 is a block diagram of an exemplary display for the detector of FIG. 1 illustrating that no signals are currently being detected.

Referring back to FIG. 5, at 323, a check is made to see whether a detected signal that is being tracked at 322 is currently being suppressed or whether that signal being tracked is being displayed as a warning. If the signal is being suppressed (described below with reference to FIG. 8), then the process starts over. If the signal is not being suppressed currently, e.g., as illustrated by the alert shown in FIG. 6, a decision is made at 324 as to whether a companion signal is detected that would identify the signal as a false alarm. Exemplary approaches to identifying companion signals are set out in greater detail herein, e.g., by looking for a pattern such as a single occurrence or a repeating pattern of switching or burst signals that are harmonically related to switching leaky local oscillators from a nearby detector. If no companion signal is detected at 324, then the detector 100 continues to issue the alarm at 326, e.g., by maintaining the visual warning designation and/or by sounding an audible signal as illustrated in FIG. 6.

Figure 7:
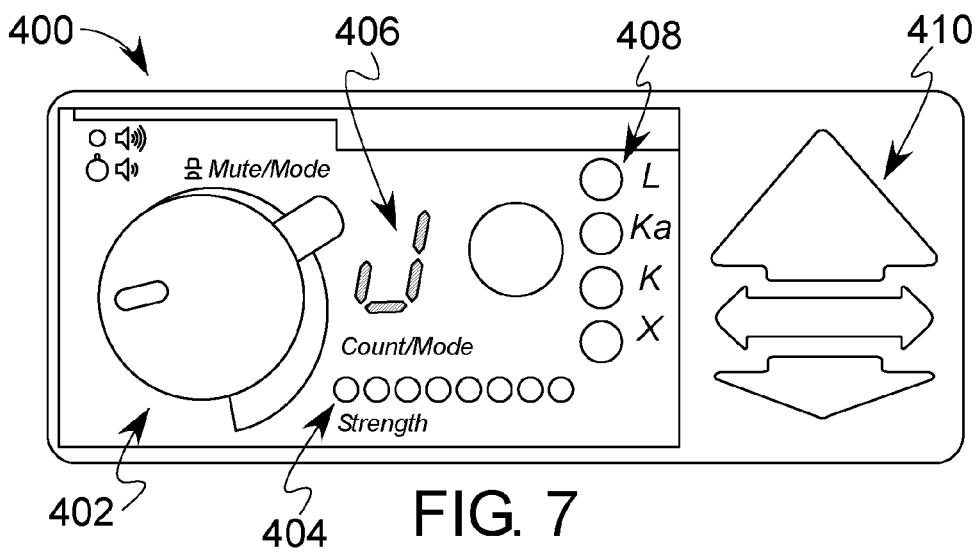
FIG. 7 is a block diagram of an exemplary display for the detector of FIG. 1 illustrating the designation of a previously detected signal as being a false alarm.

However, if a companion signal is detected at 324, then a post-detect false alarm signal is triggered at 328. Such may be accomplished by changing or issuing a predetermined audible signal and/or by altering, changing or otherwise affecting a display. For example, an icon may be illuminated, flashed or otherwise distinguished to indicate that a false alarm has been identified. Referring briefly to FIG. 7, the front panel 400 has been updated to provide a second alert, which indicates that a previously identified signal is a false alarm. In the illustrative example, the signal strength indicia have been removed from the strength indicator 404. The signal count of "1" in the example has been replaced by the alpha designation of the letter "J" in the count/mode indicator 406 to indicate a false alarm. Further, the visual display adjacent to the Ka indicia in the band indicator 408 has been removed and the up arrow in the direction indicator 410 has been deactivated. Optionally, if an audible alarm is sounding, the alarm can be changed to a different audible sound or the audible alarm may be turned off.

Referring back to FIG. 5, the in-band signal that has now been determined to be a nuisance signal is marked as such and suppressed or otherwise removed from the display and/or audible warning at 330. This may occur a predetermined period after signaling that a detected, in-band threat is actually a nuisance signal. For example, within several seconds of identifying a signal as a false alarm at 328, the display of the false alarm, e.g., as shown in FIG. 7, may be removed from the display. For example, referring briefly to FIG. 8, the front panel 400 has been updated to indicate that the previously identified signal is no longer a valid in-band signal. The count/mode indicator 406 has been replaced with the alpha designation of the letter "A". Optionally, any audible alarms may also be turned off.

Thus, the detector 100 may issue alarms for new in-band signals that have no immediately detectable companion signals, thereby providing maximum early warning potential. By adding a new display sequence and/or audio indication of a signal's subsequent disqualification, the operator of the detector 100 is more fully informed of the situation at hand while not being forced to suffer prolonged exposure to annoying alarms from nearby leaky detectors.

Moreover, the detection of companion signals to confirm a false alarm allows the detector 100 to confirm a false alarm without necessarily relying on the detection of multiple harmonics of the same, detected in-band signal to disqualify that signal as being likely leaked from a nearby detector. Companion signals may be used to discriminate and disqualify in-band signals, and those companion signals do not need to be harmonically related or even occur at the same time of the detected in-band signals. The false alarm indicating companion signals may even be detected before detecting a corresponding in-band signal, e.g., by identifying a corresponding in-band signal within a predetermined time or other measure of detecting the false alarm indicating companion signal.

For example, the tracking step at 322 can track detected signals including in-band signals and out of band signals that may be judged to be false alarm indicating companion signals. The system can track the history of each signal for predetermined periods, e.g., until the tracked signals cease to be detected. Such an approach may be used for example, to identify repeating, cyclical patterns useful for identifying in-band signals as false alarms. Thus, an in-band signal and its corresponding false alarm indicating companion signal do not need to be detected in the same sweep cycle. Moreover, the order of detecting the in-band signal and its corresponding false alarm indicating companion signal need not be specific. Thus, the detector 100 can track and update determinations of detected signals as either valid signals or nuisance signals across multiple sweep cycles of the detector 100.

For example, it may be the case that companion signals fade into and out of detection, e.g., due to the timing of the switching the nearby leaky local oscillators, the relative signal strength of the harmonics of the leaky signals, the sweep rate of the detector 100, or due to interference, etc. By identifying a signal as a companion of a detected nuisance in-band signal from a leaky local oscillator once, the corresponding in-band signal can remain suppressed, e.g., until a predetermined amount of time after the signal is no longer detectable. For example, with reference to step 323 in FIG. 5, previously detected in-band signals continue to be tracked, even after they are suppressed from display to the user, regardless of the status of their corresponding nuisance signals. Such signals may be tracked for example, until a predetermined time after the in-band signal being tracked disappears from detection.

Moreover, by tracking and maintaining a history of signals, including in-band and out of band signals, a signal can be tracked and stored, e.g., such as a detected 32.6 GHz, before the detection of its associated in-band companion signal, e.g., at 33.8 GHz. Thus, a nuisance signal can be suppressed before an alert is issued, e.g., as set out in the method associated with FIG. 4.

The detector 100 may also rely on related sub-harmonic signals that accompany nuisance local oscillator leakage which appears in valid radar bands for detecting false alarms in addition to searching for companion signals, such as when the in-band leakage of one local oscillator in a nearby detector may be substantially stronger than the companion-indicating signal energy. For example, the third harmonic (34.5 GHz), which may be detected in the Ka band, of leakage from a nuisance local oscillator around 11.5 GHz, can be identified as a false alarm signal by also detecting a simultaneous signal at 23 GHz, the second harmonic of the 11.5 GHz leaky local oscillator.

Thus, signals in the Ka band within a range of frequencies that could be present due to leaked third harmonics of local oscillator signals of a nearby radar detector 100 may also be processed for possible suppression. Given a commonly used nominal local oscillator frequency of 11.5 GHz and allowing a range of typically 11.4 to 11.9 GHz, the suspect range of frequencies deemed to be nuisance signals caused by possible third harmonic spurious local oscillator signals in a working embodiment of the radar detector 100 is then from about 34.2 GHz to about 35.7 GHz, which are already covered by the sweep ranges identified, for example, in rows 1 and 2 of Table 1.

Accordingly, a signal that is detected in the Ka band, e.g., at 34.5 GHz can be identified as a false alarm caused by a third harmonic of a spurious local oscillator signal if a signal can also be detected which is ⅔ the frequency of the detected signal in the Ka band. As suggested by the exemplary values in Table 1, and in particular, in row 4 of Table 1, the frequencies of received electromagnetic signals ($F_{RF}$) which are scanned by the first local oscillator 136 during each sweep cycle of the K band and the Ka band include 22.809 GHz through 24.487 GHz. This frequency range is referred to as Interference & K band signals and includes signals around 23 GHz, which is the second harmonic of a local oscillator operating around 11.5 GHz. While signals around 23 GHz would normally be considered interference, in the radar detector 100, these signals are detected during normal scanning operations so that they are available to help determine whether a signal in a corresponding portion of the Ka band is an actual radar signal of interest or a nuisance signal leaked from a nearby radar detector.

Frequency values and ranges shown and described herein are exemplary and are presented by way of illustration and not by way of limitation. Moreover, in practice, the use of guard bands and reasonable tolerances is to be anticipated, and was omitted for clarity of discussion herein. Moreover, in determining whether a ⅔ signal or companion signal is located, the signal conditioning and control circuitry 108 may utilize thresholds and other techniques to discriminate various detected spurious emissions, e.g., by discarding signals that are too weak, too noisy, etc.

Having thus described the invention of the present application in detail and by reference to preferred embodiments thereof, it will be apparent that modifications and variations are possible without departing from the scope of the invention defined in the appended claims.

What is claimed is:

1. A method of operating a radar detector to suppress nuisance radar alerts due to signals received in a radar band which are not radar signals of interest, said method comprising:
   detecting a first signal in a radar band of interest;
   providing a first alert designating the detection of said first signal;
   determining whether said first signal is a nuisance signal that should be suppressed;
   providing a second alert designating that said first signal is a false alarm if it is determined that said first signal is a nuisance signal; and
   turning off said second alert after a predetermined period.

2. The method according to claim 1 wherein determining whether said first signal is a nuisance signal that should be suppressed comprises:
   identifying whether said first signal has a frequency that is a harmonic of a first nuisance local oscillator frequency;
   identifying whether a second signal has a frequency that is a harmonic of a second nuisance local oscillator frequency; and
   identifying said second signal as a companion signal of said first signal if a fundamental frequency of said second nuisance local oscillator frequency is different from and not harmonically related to a fundamental frequency of said first nuisance local oscillator frequency.

3. The method according to claim 2 further comprising:
   tracking said first signal;
   determining whether said first signal is being suppressed as a nuisance signal; and
   continuing to track said first signal as suppressed until a predetermined time after said first signal is no longer detected regardless of whether said second signal continues to be detected.

4. The method according to claim 2 wherein said first and second alerts are generated in response to detecting local oscillator signals leaked from an other radar detector and identifying said second signal as being a companion signal of said first signal comprises identifying a pattern that associates said first signal with said second signal by determining that said first signal is being leaked by said other radar detector while sweeping a first frequency range and said second signal is being leaked by said other radar detector while sweeping a second frequency range different from said first frequency range, said frequency of said second signal being different from and not harmonically related to said frequency of said first signal.

5. The method according to claim 4 wherein said first and second signals are judged to be companion signals if said pattern comprises detecting said first and second signals as being alternatively switched on and off.

6. The method according to claim 2 wherein said first signal is detected in the Ka band and said second signal is detected outside of the Ka band.

7. The method according to claim 2 wherein:
   said first signal is in the range of 33.4 to 34 gigahertz; and
   said second signal is outside of the Ka band in the range of 32 to 33 gigahertz.

8. The method according to claim 2 wherein said first and second signals are not both always simultaneously on.

9. The method according to claim 2 wherein said first and second signals are detected such that said first signal is suppressed before said first alert is issued.

10. A radar detector capable of suppressing nuisance radar alerts due to signals received in a radar band which are not radar signals of interest, comprising:
   a first processing stage that receives and filters incoming electromagnetic signals;
   a second processing stage coupled to said first processing stage that shifts the frequency of filtered electromagnetic signals received by the first processing stage;
   control circuitry that controls said first processing stage and said second processing stage, said control circuitry having a processor and memory having code embodied therein, the code comprising:
      code executable by said processor to detect a first signal in a radar band of interest;
      code executable by said processor to provide a first alert designating the detection of said first signal;
      code executable by said processor to determine whether said first signal is a nuisance signal that should be suppressed;
      code executable by said processor to provide a second alert designating that said first signal is a false alarm if it is determined that said first signal is a nuisance signal; and
      code executable by said processor to turn off said second alert after a predetermined period.

11. The radar detector according to claim 10 wherein said code executable by said processor to determine whether said first signal is a nuisance signal that should be suppressed comprises:
   code executable by said processor to identify whether said first signal has a frequency that is a harmonic of a first nuisance local oscillator frequency;
   code executable by said processor to identify whether a second signal is detected as having a frequency that is a harmonic of a second nuisance local oscillator frequency; and
   code executable by said processor to identify said second signal as a companion signal to said first signal if a fundamental frequency of said first nuisance local oscillator frequency is different from and not harmonically related to a fundamental frequency of said second nuisance local oscillator frequency.

12. The radar detector according to claim 11 wherein said memory further comprises:
   code executable by said processor to track said first signal;
   code executable by said processor to determine whether said first signal is being suppressed as a nuisance signal; and
   code executable by said processor to continue to track said first signal as suppressed until a predetermined time after said first signal is no longer detected regardless of whether said second signal continues to be detected.

13. The radar detector according to claim 11 wherein said first and second alerts are generated in response to detecting local oscillator signals leaked from an other radar detector and said code executable by said processor to identify said second signal as a companion signal to said first signal comprises code executable by said processor to identify a pattern that associates said first signal with said second signal by determining that said first signal is being leaked by said other radar detector while sweeping a first frequency range and said second signal is being leaked by said other radar detector while sweeping a second frequency range different from said first frequency range, said frequency of said second signal being different from and not harmonically related to said frequency of said first signal.

14. The radar detector according to claim 13 wherein said code executable by said processor to identify said second signal as a companion signal to said first signal comprises code executable by said processor to detect said first and second signals as being alternatively switched on and off.

15. The radar detector according to claim 11 wherein said code executable by said processor to detect a first signal in a radar band of interest comprises code executable by said processor to detect said first signal in the Ka band and said second signal outside of the Ka band.

16. The radar detector according to claim 11 wherein:
said code executable by said processor to detect a first signal in a radar band of interest comprises code executable by said processor to detect a first signal in the range of 33.4 to 34 gigahertz; and
said second signal is outside of the Ka band in the range of 32 to 33 gigahertz.

17. The radar detector according to claim 11 further comprising code executable by said processor to detect said first and second signals such that said first signal is suppressed before said first alert is issued.

18. The radar detector according to claim 10, further comprising an alarm coupled to said control circuitry, said alarm configured to provide at least one of a visual or audible indication of said first and second alarm signals.

19. The radar detector according to claim 10, further comprising a table configured in said memory to track detected in-band signals for each sweep cycle.

* * * * *